United States Patent
Klootwijk et al.

(10) Patent No.: US 7,352,042 B2
(45) Date of Patent: Apr. 1, 2008

(54) RADIATION-EMITTING SEMICONDUCTOR DEVICE AND METHOD OF MANUFACTURING SUCH A DEVICE

(75) Inventors: Johan Hendrik Klootwijk, Eindhoven (NL); Jan Willem Slotboom, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 135 days.

(21) Appl. No.: 10/535,483

(22) PCT Filed: Oct. 28, 2003

(86) PCT No.: PCT/IB03/04810

§ 371 (c)(1),
(2), (4) Date: May 17, 2005

(87) PCT Pub. No.: WO2004/047181

PCT Pub. Date: Jun. 3, 2004

(65) Prior Publication Data

US 2005/0280011 A1 Dec. 22, 2005

(30) Foreign Application Priority Data

Nov. 20, 2002 (EP) .................... 02079915

(51) Int. Cl.
*H01L 27/14* (2006.01)

(52) U.S. Cl. ............... 257/428; 257/E27.02; 257/565; 438/336

(58) Field of Classification Search ........ 257/428–430, 257/565, 566, E27.02; 438/309, 336
See application file for complete search history.

(56) References Cited

U.S. PATENT DOCUMENTS

| 4,355,320 A * | 10/1982 | Tihanyi ............... 257/462 |
| 6,252,286 B1 * | 6/2001 | Arai .................. 257/446 |
| 2002/0047175 A1 * | 4/2002 | Tani et al. ............ 257/432 |

OTHER PUBLICATIONS

Chen, J et al: Breakdown Behavior of GAAS/ALGAAS HBT'S, IEEE Transactions on Electron Devices. vol. 36, No. 10, Oct. 1989, pp. 2165-2172.

* cited by examiner

*Primary Examiner*—Brook Kebede
(74) *Attorney, Agent, or Firm*—Larry Liberchuk

(57) ABSTRACT

The invention relates to a radiation-emitting semiconductor device (10) with a semiconductor body (1) and a substrate (2), wherein the semiconductor body (1) comprises a vertical bipolar transistor with an emitter region (3), a base region (4) and a collector region (5), which regions are each provided with a connection region (6, 7, 8), and the border between the base region (4) and the collector region (5) forms a pn-junction and, in operation, at a reverse bias of the pn-junction or at a sufficiently large collector current, avalanche multiplication of charge carriers occurs whereby radiation is generated in the collector region (5). According to the invention, the collector region (5) has a thickness through which transmission of the generated radiation occurs, and the collector region (5) borders on a free surface of the semiconductor body (1).

21 Claims, 3 Drawing Sheets

RADIATION-EMITTING SEMICONDUCTOR DEVICE AND METHOD OF MANUFACTURING SUCH A DEVICE

The invention relates to a radiation-emitting semiconductor device comprising a semiconductor body and a substrate, which semiconductor body comprises a vertical bipolar transistor with an emitter region, a base region and a collector region, which regions are each provided with a connection region, and the boundary between the base region and the collector region forms a pn junction, and, during operation, at a reverse voltage across the pn junction, or at a sufficiently high collector current, avalanche multiplication of charge carriers occurs, causing radiation to be generated in the collector region. Such a device is an attractive alternative for generating light signals in semiconductor materials of the so-termed indirect type wherein an LED (=light-emitting diode) cannot be effectively manufactured.

The invention also relates to a method of manufacturing such a device.

Figure 1:
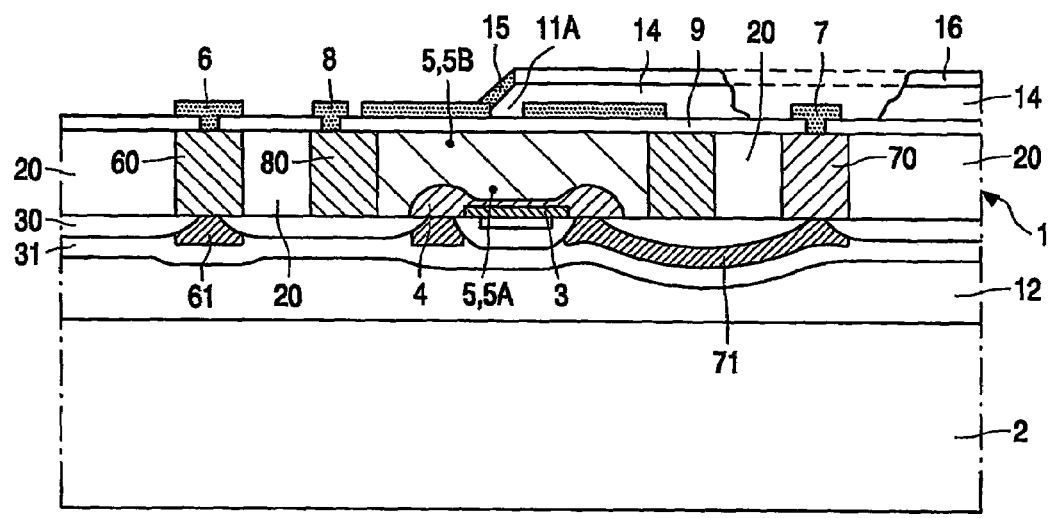

A device of the type mentioned in the opening paragraph is known from the publication by James J. Chen et. al., entitled "Breakdown Behavior of GaAs/AlGaAs HBTs" in IEEE Transactions on Electron Devices, vol. 36, No. 10, October 1989, pp. 2165-2172. In FIG. 1 of said document a bipolar transistor is shown comprising an n+ GaAs substrate supporting, in succession, a 1 μm thick n+ GaAs layer and a 0.4 μm thick n– GaAs layer, which jointly form the collector of the transistor, a 0.2 μm thick p+ GaAs layer forming the base of the transistor. The emitter of the transistor is situated thereon, which comprises a 0.2 μm thick n+ AlGaAs layer and a 0.2 μm thick n+ GaAs layer. If a sufficiently high reverse voltage is applied across the base-collector pn junction, the emission of light is observed.

A drawback of the known device resides in that the radiation generated is not effectively available because a substantial part of said radiation generated is absorbed by the surrounding semiconductor material or otherwise lost.

Therefore it is an object of the present invention to provide a device which does not have said drawback, or only to a much smaller degree, and wherein the radiation generated can be effectively used as a signal source.

This object is achieved, in accordance with the invention, by means of a device of the type mentioned in the opening paragraph which is characterized in that the collector region has a thickness such that transmission of the generated radiation occurs, and the collector region borders on a free surface of the semiconductor body.

As a result of the small thickness of the collector region, said collector region is substantially transparent to the radiation generated. As the collector region borders on the free semiconductor surface, comparatively much radiation can issue through the free semiconductor surface. The amount of radiation can be adjusted with the reverse voltage across the base-collector junction and, independently thereof, with the magnitude of the collector current.

The collector region may comprise a first sub-region that borders on the base region, and a second sub-region that borders on the first sub-region and that has a higher conductance than the first sub-region. Advantageously, the second sub-region of the collector region has a smaller thickness than the first sub-region and borders on the free surface of the semiconductor body.

The device is primarily based on the recognition that in a reversed structure of the transistor as compared to that of the known device, and at suitably chosen dimensions of sub-regions of the collector, on the one hand, much less radiation is lost by absorption and, on the other hand, the radiation that is available can be applied much more effectively as a signal source. In addition, the invention is based on the recognition that by means of a method in accordance with the invention such a reversal of the structure can be readily achieved. This method means inter alia that a semiconductor substrate situated on the collector side can be substituted with, for example, a glass substrate on the emitter side. The radiation generated can freely issue from the collector region because the collector region borders on the free surface of the semiconductor body. Unlike the prior art, the radiation generated no longer has to pass through the thick semiconductor substrate. As a result, the absorption losses are very small in a device in accordance with the invention. Furthermore, a second sub-region bordering on the surface of the semiconductor body can readily be made in a very small thickness by means of a method in accordance with the invention. After all, substrates are available that are provided with an isolating layer on which a very thin, for example 20 nm thick, highly doped layer is present, in particular of the n+ conductivity type. Such a structure is particularly suitable as the starting point for the manufacture of a device in accordance with the invention by means of a method according to the invention.

Like in the known device, the radiation generated may comprise visible light. A part of the radiation generated comprises a flow of charge carriers such as, preferably, electrons which can issue from the semiconductor body and end up in a layer comprising an electroluminescent material such as a phosphor. Thus, radiation here also includes electron radiation that is converted to visible radiation by means of an electroluminescent material provided on the device.

In a preferred embodiment of a device in accordance with the invention, the collector region that borders on the surface of the semiconductor body is covered with an electrically insulating layer which is transparent to the radiation generated. On the electrically insulating layer there is a gate electrode comprising a part that is transparent to the radiation generated. During operation of the device, the second sub-region of the collector region is formed by a conductive channel induced in the first sub-region by means of the gate electrode. Such a channel may be very thin, which enhances the effective availability of the radiation generated. This modification is based on the recognition that a gate electrode, which is usually made of a metal which is not transparent to radiation such as visible light, can be provided in various ways with a radiation-transparent part. It is for example possible to manufacture the entire gate electrode of a radiation-transparent, yet properly electroconductive material, such as a material comprising-indium-tin oxide. The insulating layer may advantageously comprise an electroluminescent material, so that electron radiation issuing from the semiconductor body during operation can be converted to visible radiation.

In a further modification, the gate electrode is made of a metal such as aluminum, but the gate electrode has an aperture through which radiation can leave the semiconductor body. If such an aperture is sufficiently small, for example of the order of 1 μm or less, a continuous, conductive channel can still form under the entire electrode when a suitable voltage is applied to the gate electrode.

In a further attractive modification of a device in accordance with the invention, a part of the base region bordering on the collector region comprises a semiconductor material having a smaller band gap than the rest of the base region and the collector region. By virtue thereof, the device carries, at a comparable voltage, a higher collector current, as a result of which the effectivity with which radiation is generated is increased.

In an important embodiment, the semiconductor body is attached to the substrate by a further surface opposite the surface on which the collector region borders, using an adhesive layer. This enables a semiconductor body to be manufactured comprising a minimum amount of semiconductor material that absorbs the radiation generated. For example, the substrate among other things can be made of an absolutely non-absorbing material such as glass.

In such a case, the connection regions of the emitter region, the base region and the collector region are preferably situated at the surface of the semiconductor body on which the collector region borders. By virtue thereof, it is possible to refrain entirely from using the substrate as an electroconductive region.

In a particularly advantageous further embodiment, a radiation conductor provided with means for coupling the radiation generated into the radiation conductor is present on the surface on which the second sub-region borders.

Such a radiation conductor enables the radiation generated to be readily transmitted in a direction parallel to the surface of the semiconductor body, for example to the edge of the semiconductor body where the radiation can cross to a neighboring, separate semiconductor body, for example to a similar radiation conductor situated thereon. The means used to couple the radiation into the radiation conductor can also be used to couple the radiation out of said radiation conductor and into a (different) semiconductor body where it can be detected, for example, with a radiation-sensitive pn-junction.

The material of the semiconductor body advantageously comprises silicon, and, if applicable, a part of the base region that comprises a semiconductor material with a smaller band gap comprises a composition of silicon and germanium. In this manner a semiconductor material is obtained which, as such, is applied on a very large scale and which gives the attractive possibility of "optical communication" both "inter-chip" and "intra-chip".

A method of manufacturing a radiation-emitting semiconductor device in which, in a semiconductor body, a vertical bipolar transistor is formed with a collector region, a base region and an emitter region, which are each provided with a connection region, is characterized in accordance with the invention in that the semiconductor body is formed as a thin layer of a semiconductive material that is separated from a temporary substrate by means of an electrically insulating layer, and the vertical bipolar transistor is formed in the semiconductor body, after which the substrate is attached onto a side of the semiconductor body opposite the electrically insulating layer, whereafter the temporary substrate is removed. In this manner, a radiation-emitting semiconductor device in accordance with the invention is obtained.

In a preferred embodiment of a method in accordance with the invention, the substrate is attached onto a side of the semiconductor body opposite the electrically insulating layer by means of an adhesive layer. In this manner, a reversal of the structure of the known bipolar transistor necessary for the radiation-emitting semiconductor device in accordance with the invention is obtained in a simple manner.

The electrically insulating layer can be removed, for example, by using a selective chemical etchant, as a result of which the collector region borders on the free semiconductor surface.

Preferably, in a semiconductor substrate a buried isolating layer is formed by means of ion implantation, the semiconductor body being formed by the part of the semiconductor substrate situated above the isolating layer, and the temporary substrate being formed by the part of the semiconductor substrate situated under the isolating layer. Alternatively, the thin layer of a semiconductive material may be formed by the silicon layer of a silicon-on-insulator wafer. Such a method can also very suitably be used to form an integrated circuit in the semiconductor body by means of a high-yield process. By virtue of the invention in question, such an IC is provided with the possibility of optical signal exchange. For this purpose, preferably the further surface of the semiconductor body on which the second sub-region borders, is provided with a radiation conductor which is provided with means for coupling the radiation to be generated in the device into the radiation conductor. Said radiation conductor can be provided, at a different location of the semiconductor body, with similar means enabling the radiation to be coupled into the semiconductor body and to be detected there.

These and other aspects of the invention are apparent from and will be elucidated with reference to the embodiment(s) described hereinafter.

Figure 6:
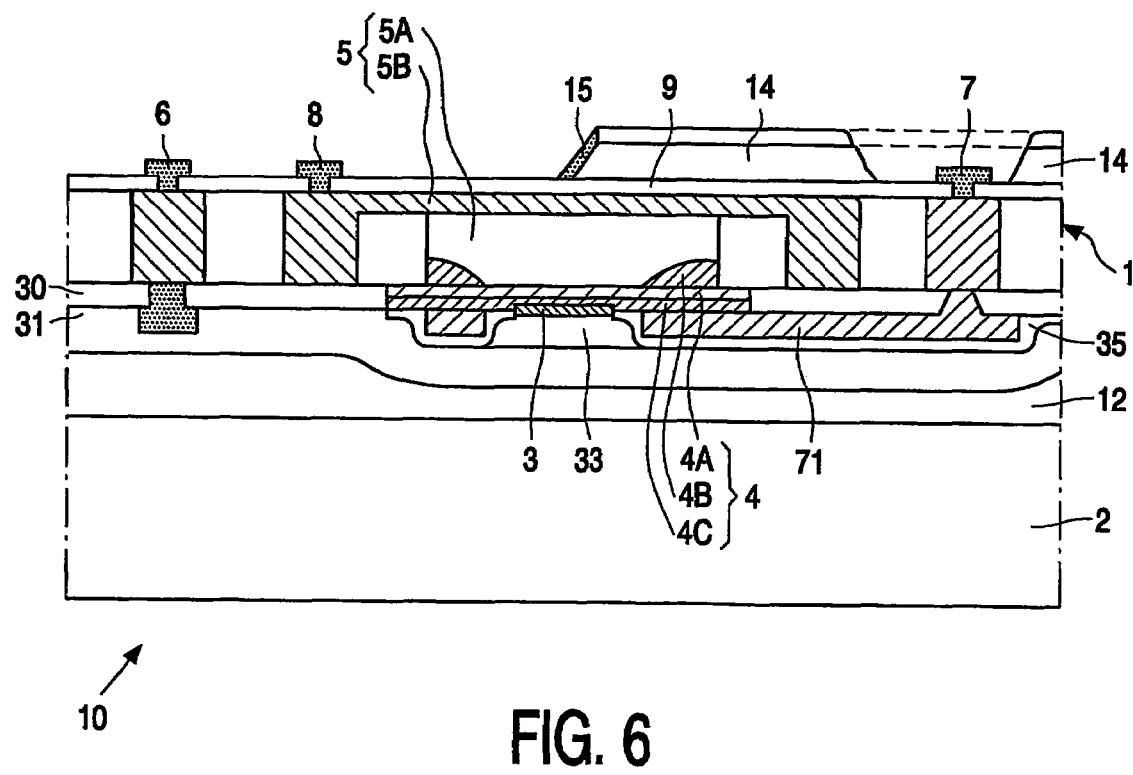

In the drawings:

FIG. 1 is a diagrammatic cross-sectional view, at right angles to the thickness direction, of a first example of a radiation-emitting semiconductor device in accordance with the invention, FIGS. 2 through 5 are diagrammatic cross-sectional views, at right angles to the thickness direction, of the device shown in FIG. 1 in successive stages of the manufacture by means of an embodiment of a method in accordance with the invention, and FIG. 6 is a diagrammatic cross-sectional view, at right angles to the thickness direction, of a second example of a radiation-emitting semiconductor device in accordance with the invention.

The figures are not drawn to scale and some dimensions, such as notably the dimensions in the thickness direction, are exaggerated for clarity. Corresponding regions or parts in the different Figures are indicated by means of the same reference numerals whenever possible.

FIG. 1 is a diagrammatic cross-sectional view, at right angles to the thickness direction, of a first embodiment of a radiation-emitting semiconductor device in accordance with the invention. A device 10 comprises a semiconductor body 1 and a substrate 2. In the semiconductor body 1 there is a vertical bipolar transistor with an emitter region 3, a base region 4 and a collector region 5, which are each provided with a connection region 6, 7, 8, respectively. The collector region 5 has a first sub-region 5A that borders on the base region 4 and, at least during operation of the device 10, a second sub-region 5B that borders on the first sub-region 5A and is higher doped than said first sub-region 5A. The thickness and the dimensions of the first sub-region 5A are here chosen to be such that at a sufficiently high reverse voltage across the pn junction between the base region 4 and the collector region 5 radiation is generated in the collector region 5 as a result of avalanche multiplication of charge carriers.

In accordance with the invention, the second sub-region 5B of the collector region 5 has a smaller thickness than the first sub-region 5A and borders on a free surface of the semiconductor body 1. By virtue thereof on the one hand, a smaller proportion of the radiation generated is lost by absorption or by other causes and, on the other hand, the radiation generated can be used more readily as a signal source that makes it possible, for example, to guide the signal to another part of the semiconductor device 10. In this example, the surface of the semiconductor body 1 on which the second sub-region 5B of the collector region 5 borders is covered with an electrically insulating layer 9 which is transparent to the radiation generated and on which a gate electrode 11 is situated having a part 11A which is transparent to the radiation generated. During operation of the device 10, the second sub-region 5B of the collector region 5 is formed as a conductive channel near the surface of the semiconductor body 1, which conductive channel is induced in the first sub-region 5A by means of a suitable potential on the gate electrode 11. In this case, the gate electrode 11 is made of a metal, for example aluminum, and provided with an aperture 11A through which radiation can leave the semiconductor body 1. At sufficiently small dimensions of the aperture 11A, here a round aperture having a diameter of for example 0.75 μm, a continuous channel will still have been formed under the electrode 11 during operation of the device 10.

In this example, the semiconductor body 1 is attached, at a further surface situated opposite the free surface on which the second sub-region 5B of the collector region 5 borders, to the substrate 2, which here comprises glass, by means of an adhesive layer 12. By virtue thereof, the loss of radiation due to absorption can be further reduced. In addition, a device 10 in accordance with the invention can be readily manufactured in this way, as will be discussed hereinbelow. In connection with this manufacture, the connection regions 6, 7, 8 of the emitter region 3, the base region 4 and the collector region 5 are situated, in this case, at the free surface of the semiconductor body 1 on which the second sub-region 5B of the collector region 5 borders.

The emitter region 3 is connected, via an electric conductor, to the emitter connection region 6 (in a back face of FIG. 1).

The device 10 of this example comprises, on the surface on which the second sub-region 5B of the collector region 5 borders, a radiation conductor 14 which is provided with means for coupling the radiation generated in the device 10 into the radiation conductor 14. Said conductor 14 here comprises a 1 μm thick strip-shaped region of silicon nitride which is provided on the insulating layer 9 which, in this case, is made of silicon dioxide. An end face of the conductor 14 situated above the aperture 11A in the gate electrode 11 is provided, by means of etching, with a bevel face that includes an angle of approximately 45 degrees with the surface of the semiconductor body 1 and is covered with an aluminum layer 15 which serves as a mirror surface. In this manner, the radiation generated in the device 10 is coupled into the conductor 14. At the location of the connection region 7 of the base region 4, the conductor 14 is interrupted in the Figure in connection with the representation of the connection region 7 which in actual fact is situated behind the plane of the drawing wherein the conductor 14 is situated. The upper side as well as the side faces of the strip-shaped conductor 14 are covered with a further layer 16 of silicon dioxide, as a result of which the conductor 14 is surrounded by material (SiO$_2$) having a lower refractive index (n=1.4) than silicon nitride that has a refractive index of approximately 1.8. The silicon nitride part of the conductor 14 is approximately 1 μm×1 μm in cross-section. The SiO$_2$ layers 9, 16 have a thickness of a few tenths of a μm.

The device 10 of this example comprises an integrated circuit two parts of which, which are electrically insulated from each other, can optically communicate with each other. The first part is shown in FIG. 1, a second part is situated to the right thereof, and another end portion of the radiation conductor 14 is provided at said location with a mirror surface enabling radiation from the conductor 14 to enter the semiconductor body 1, thereby enabling, for example, a radiation-sensitive pn junction to which a reverse voltage is applied to be detected.

In this case, the semiconductor body 1 comprises a number of suitably doped semiconductor regions 60, 70, 80 on which the connection regions 6, 7, 8 of the transistor are situated and which are mutually electrically separated by means of so-termed trench-insulation regions 20 comprising silicon dioxide. Conductor tracks 61, 71 couple, respectively, the emitter region 3 and the base region 4 to the associated semiconductor region 60, 70. The semiconductor region 80 is directly connected to the collector region 5. The device 10 further comprises other insulating layers 30, 31, here also of silicon dioxide, which provide the necessary mutual electric insulation between the conductor tracks 61, 71 and which separate the semiconductor body 1 from the adhesive layer 12.

The manufacture of the device 10 will be explained next.

FIGS. 2 through 5 are diagrammatic cross-sectional views, at right angles to the thickness direction, of the device 10 of this example in successive stages of the manufacture by means of an embodiment of a method in accordance with the invention. There is started from (see FIG. 2) a semiconductor substrate 222 of n-type silicon wherein an electrically insulating layer 9 is formed by means of an oxygen ion implantation. Above said semiconductor substrate there is a part 111 from which a semiconductor body 1 will be formed, and below said semiconductor substrate there is a further part 22 that serves as a temporary substrate of the device 10 to be formed. Alternatively, it is possible to start from a silicon-on-insulator (SOI) wafer. In this case, the semiconductor body 111 is formed by the silicon layer of the SOI wafer.

Subsequently (see FIG. 3), a bipolar transistor, as described with reference to FIG. 1, is formed in the part 111 of the substrate 222. In this process, the surface of the semiconductor body 1 is eventually covered by means of the insulating layer 31.

Subsequently (see FIG. 4), a glass substrate 2 is attached to the device by means of an adhesive layer 12.

Next (see FIG. 5), the temporary substrate 22 is removed by means of etching in an aqueous solution of KOH. In this process, the insulating layer 9 of silicon dioxide is used as an etch-stop layer, which is eventually exposed and forms an optically transparent coating of the free surface of the semiconductor body 1 on which the collector region 5 borders. Subsequently (see FIG. 1) the gate electrode 11 provided with an aperture 11A is formed by means of evaporation, photolithography and etching. Simultaneously, the connection regions 6, 7, 8 are formed. For this purpose, apertures are previously formed in the insulating layer 9 at the desired locations where the semiconductor regions 60, 70, 80 border on the surface.

Next, the strip-shaped radiation conductor 14 is formed also by means of, in succession, evaporation, photolithography and etching, and an end portion thereof situated above the aperture 11A is provided with a side face extending at an angle of 45° to the surface. This side face is provided with a metal layer 15 by means of evaporation, which metal layer serves as a mirror that sends the radiation from the semiconductor body 1 into the radiation conductor 14. The manufacture of the latter is completed by applying a silicon dioxide layer 16, as a result of which the upper side and the side faces of the strip-shaped radiation conductor 14 are covered with a layer having a lower refractive index. Individual, ready-to-use devices 10 can now be obtained by means of a separation technique such as sawing.

Figure 2:
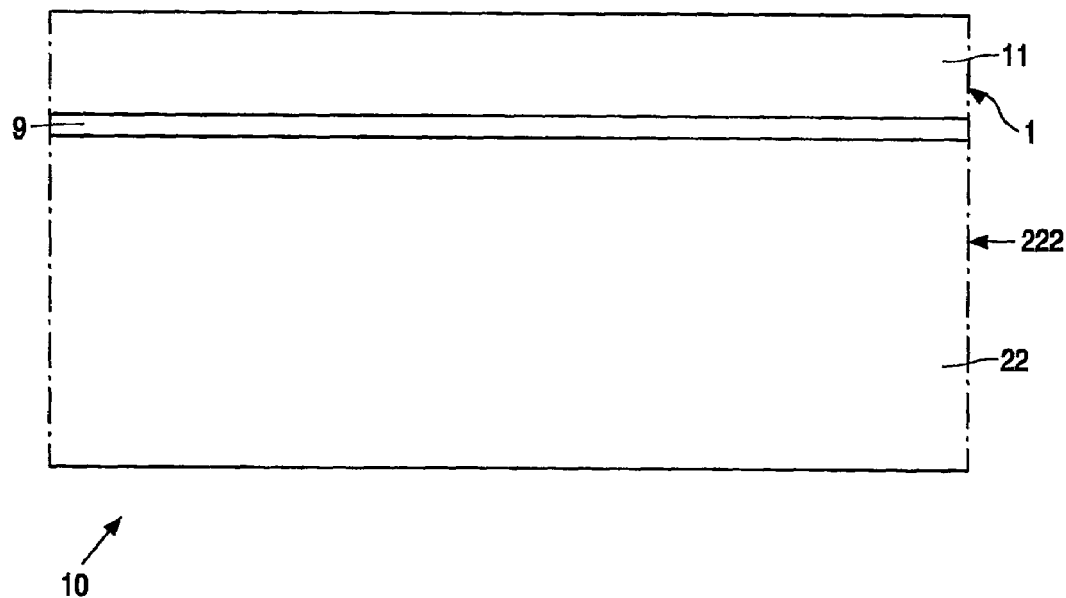
Figure 3:
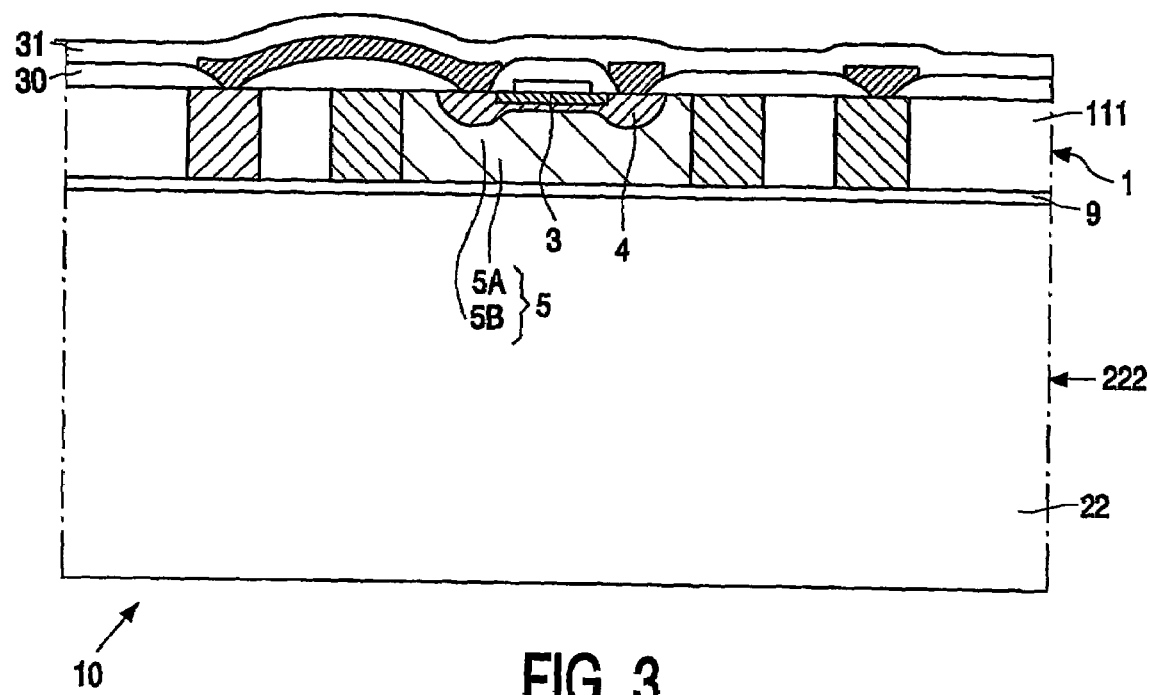
Figure 4:
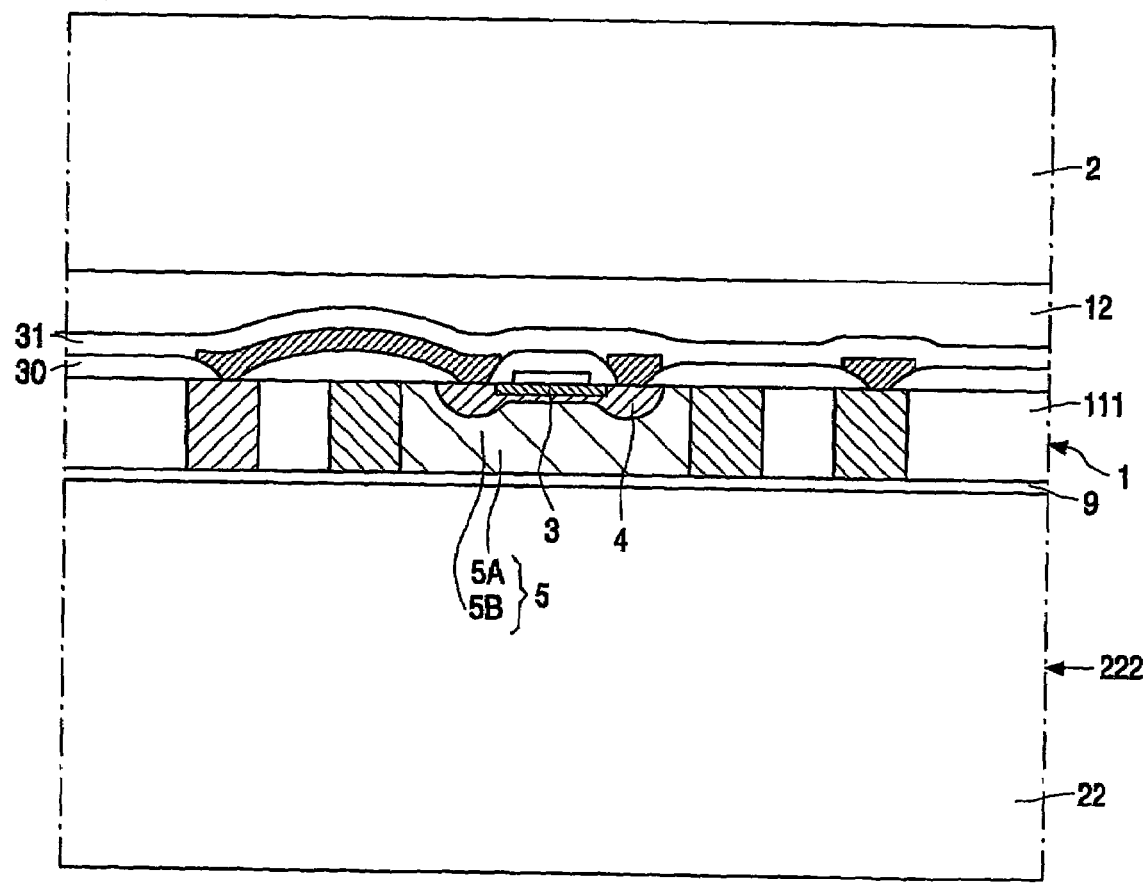
Figure 5:
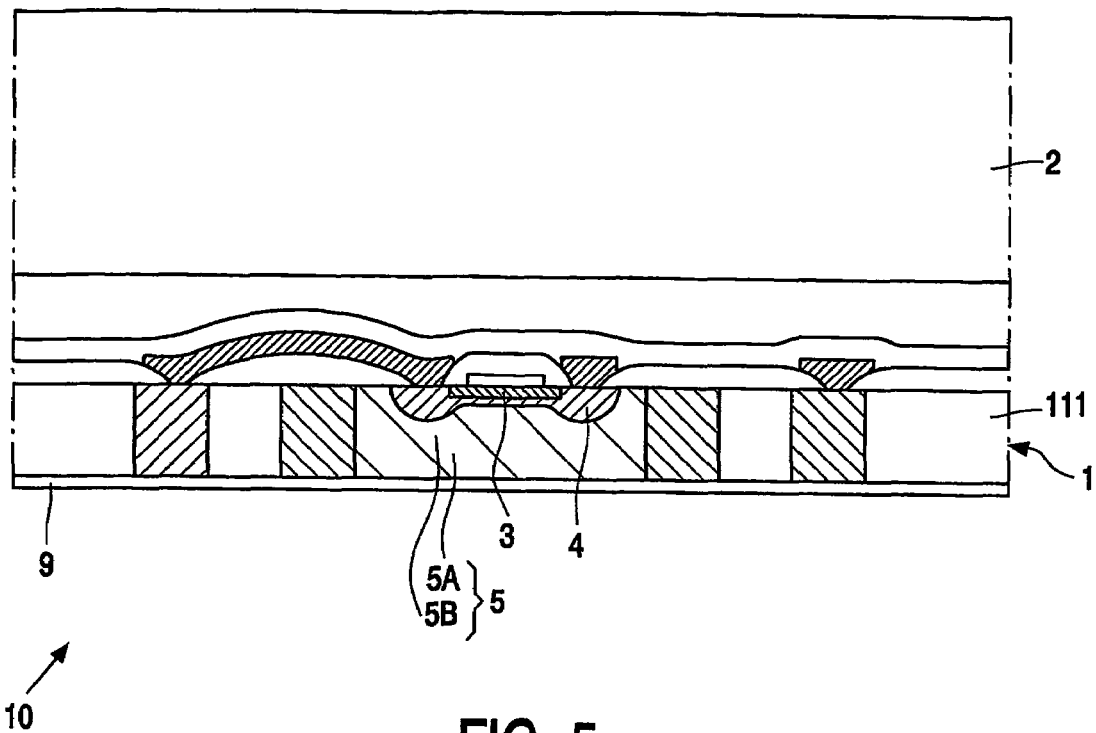

FIG. 6 is a diagrammatic cross-sectional view, at right angles to the thickness direction, of a second example of a radiation-emitting semiconductor device in accordance with the invention. The most important differences with the device of a previous example are the following. In the first place, in this example the sub-region 5B of the collector region is formed at the beginning of the manufacturing process. The part 111 of the device to be formed then comprises a very thin, for example 20 nm thick, n+ layer 5B on which a thicker n− layer 5A is provided. An important advantage thus obtained is that a structure as shown in FIG. 2 and in which the part 111 only comprises a very thin n+ layer 5B can be purchased from specialized companies. The subsequent provision of a thicker n− layer 5A on the thin n+ layer 5B substantially does not have to lead to a widening of the thin n+ layer 5B. In connection with the presence of the thin n+ layer 5B, the device 10 of this example also does not comprise a gate electrode. In the second place, in this example the base region 4 comprises a part 4A that borders on the first sub-region 5A of the collector region 5 and that comprises a mixed crystal of silicon and germanium. By virtue of this local reduction of the band gap in the base region 4, the collector current can become sufficiently large to bring about the generation of radiation. The part 4A of the base region 4 here comprises 30 at. % germanium and has a thickness of approximately 20 nm. Furthermore, the base region 4 comprises a 30 nm thick silicon part 4C situated on said part 4A and regions 4B which are formed by means of outdiffusion from a polycrystalline p+ type silicon layer 71, which here also serves as a conductor track. In this case, also the n-type emitter region 3 is formed by means of outdiffusion from a polycrystalline silicon layer 33 with an n-type impurity. The polycrystalline layers 71, 33 are separated from each other by means of a thin silicon nitride layer 35. Apart from the above-mentioned ion implantation for the sub-region 5B of the collector region 5 and the details regarding the manufacture of the bipolar transistor, the manufacture by means of a method in accordance with the invention does not differ from the manufacture of the device 10 of the previous example as discussed with reference to FIGS. 2 through 5.

The invention is not limited to the example described herein since, within the scope of the invention, many variations and modifications are possible to those skilled in the art. For example, devices can be manufactured having a different geometry and/or different dimensions.

Instead of a semiconductor body of Si, use can also be made of a semiconductor body of Ge or III-V compounds such as GaAs or InP. The invention offers an advantage, in particular, if such semiconductor materials are of the indirect type, such as InAs or AlP.

In the case of a semiconductor body of Si, this does not necessarily have to comprise (exclusively) monocrystalline silicon. Also polycrystalline parts are suitable for certain applications.

It is further noted that the device may comprise further active and passive semiconductor elements or electronic components, such as diodes and/or transistors and resistors and/or capacitors, whether or not in the form of an integrated circuit. The manufacture is of course efficiently adapted thereto.

The invention claimed is:

1. A radiation-emitting semiconductor device comprising a semiconductor body and a substrate, which semiconductor body comprises a vertical bipolar transistor with an emitter region, a base region and a collector region, which regions are each provided with a connection region, and the boundary between the base region and the collector region forms a pn junction, and, during operation, at a reverse voltage across the pn junction, or at a sufficiently high collector current, avalanche multiplication of charge carriers occurs, causing radiation to be generated in the collector region, characterized in that the collector region has a thickness such that transmission of the generated radiation occurs, and the collector region borders on a free surface of the semiconductor body.

2. A radiation-emitting semiconductor device as claimed in claim 1, wherein the collector region comprises a first sub-region that borders on the base region and a second sub-region that borders on the first sub-region and that has a higher conductance than the first sub-region, characterized in that the second sub-region of the collector region has a smaller thickness than the first sub-region and borders on the free surface of the semiconductor body.

3. A radiation-emitting semiconductor device as claimed in claim 1, characterized in that the surface of the semiconductor body on which the collector region borders is covered with a layer comprising an electroluminescent material.

4. A radiation-emitting semiconductor device as claimed in claim 1, characterized in that the surface of the semiconductor body on which the collector region borders is covered with an electrically insulating layer which is transparent to the radiation generated and on which a gate electrode is present having a part which is transparent to the radiation generated.

5. A radiation-emitting semiconductor device as claimed in claim 4, characterized in that during operation of the device, the second sub-region of the collector region is formed by a conductive channel near the free surface of the semiconductor body, which conductive channel is induced in the first sub-region by means of the gate electrode.

6. A radiation-emitting semiconductor device as claimed in claim 5, characterized in that the gate electrode comprises a metal layer which is provided with an aperture.

7. A radiation-emitting semiconductor device as claimed in claim 1, characterized in that a part of the base region bordering on the first sub-region of the collector region comprises a semiconductor material having a smaller band gap than the rest of the base region and the collector region.

8. A radiation-emitting semiconductor device as claimed in claim 1, characterized in that the semiconductor body is attached to the substrate by a further surface opposite the free surface on which the collector region borders, using an adhesive layer.

9. A radiation-emitting semiconductor device as claimed in claim 1, characterized in that the connection regions of the emitter region, the base region and the collector region are situated at the surface of the semiconductor body on which the collector region borders.

10. A radiation-emitting semiconductor device as claimed in claim 1, characterized in that a radiation conductor provided with means for coupling the radiation generated in the device into the radiation conductor is present on the surface on which the collector region borders.

11. A radiation-emitting semiconductor device as claimed in claim 1, characterized in that the device forms an integrated circuit with two electrically insulated regions which are in optical communication with each other by means of the radiation generated.

12. A radiation-emitting semiconductor device as claimed in claim 1, characterized in that the material of the semiconductor body comprises silicon, and, if applicable, a part of the base region that comprises a semiconductor material with a smaller band gap comprises a composition of silicon and germanium.

13. A radiation-emitting semiconductor device as claimed in claim 1, characterized in that the substrate comprises an insulator.

14. A method of manufacturing a radiation-emitting semiconductor device comprising:
  forming in a semiconductor body a vertical bipolar transistor with a collector region, a base region, and an emitter region, which regions are each provided with a connection region, wherein the semiconductor body is formed as a thin layer of a semiconductive material that is separated from a temporary substrate by means of an electrically insulating layer; and
  attaching the substrate onto a side of the semiconductor body opposite the electrically insulating layer, whereafter the temporary substrate is removed.

15. A method as claimed in claim 14, characterized in that the substrate is attached onto the side of the semiconductor body opposite the electrically insulating layer by means of an adhesive layer.

16. A method as claimed in claim 14, characterized in that the electrically insulating layer is removed, as a result of which the collector region borders on a free semiconductor surface.

17. A method as claimed in claim 14, characterized in that the insulating layer is coated with an electroconductive layer which is transparent to radiation.

18. A method as claimed in claim 17, characterized in that the electroconductive layer serves as a gate, and an inversion channel is formed in the collector region.

19. A method as claimed in claim 14, characterized in that in a semiconductor substrate the electrically insulating layer is formed by means of ion implantation, the semiconductor body being formed by a part of the semiconductor substrate situated above the insulating layer, and the temporary substrate being formed by the part of the semiconductor substrate situated under the insulating layer.

20. A method as claimed in claim 14, characterized in that the thin layer of a semiconductive material is formed by the silicon layer of a silicon-on-insulator wafer.

21. A method as claimed in claim 14, characterized in that the surface of the semiconductor body on which the collector region borders is provided with a radiation conductor which is equipped with means for coupling the radiation to be generated in the device during operation into the radiation conductor.

* * * * *